(12) United States Patent
Sherman (10) Patent No.: US 9,817,932 B2
(45) Date of Patent: Nov. 14, 2017

(54) RECOGNIZING AND UTILIZING CIRCUIT TOPOLOGY IN AN ELECTRONIC CIRCUIT DESIGN

(71) Applicant: Mentor Graphics Corporation, Wilsonville, OR (US)

(72) Inventor: Alan Sherman, Silver Spring, MD (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/007,440

(22) Filed: Jan. 27, 2016

(65) Prior Publication Data

US 2017/0161408 A1  Jun. 8, 2017

Related U.S. Application Data

(60) Provisional application No. 62/262,800, filed on Dec. 3, 2015.

(51) Int. Cl.
*G06F 17/50* (2006.01)

(52) U.S. Cl.
CPC ........ *G06F 17/505* (2013.01); *G06F 17/5072* (2013.01); *G06F 17/5077* (2013.01); *G06F 17/5081* (2013.01)

(58) Field of Classification Search
CPC ............... G06F 17/505; G06F 17/5081; G06F 17/5077; G06F 17/5072
See application file for complete search history.

(56) References Cited

U.S. PATENT DOCUMENTS

| | | | | |
|---|---|---|---|---|
| 6,269,277 B1 * | 7/2001 | Hershenson | ........ | G06F 17/5063 700/121 |
| 6,802,050 B2 * | 10/2004 | Shen | ................... | G06F 17/5068 257/E27.107 |
| 7,386,823 B2 * | 6/2008 | Tsai | ..................... | G06F 17/5045 716/102 |
| 7,679,396 B1 * | 3/2010 | Kao | ............... | H03K 19/018578 326/27 |
| 7,739,646 B2 * | 6/2010 | Lin | ..................... | G06F 17/5072 716/119 |
| 8,352,893 B1 * | 1/2013 | Lin | ..................... | G06F 17/5081 716/104 |

(Continued)

*Primary Examiner* — Naum B Levin
(74) *Attorney, Agent, or Firm* — Mentor Graphics Corporation (57) ABSTRACT

This application discloses tools to build a topology library including one or more topologies, each of which includes a description of multiple transistors, their parameters, and associated connectivity, and also includes rules or criteria to be utilized in downstream design flow processes. The tools can analyze a circuit design describing an electronic device to recognize a subset of transistors in the electronic device has a pre-defined circuit topology, and identify layout rules or simulation criteria for the transistors in the recognized circuit topology. The tools can utilize the layout rules to automatically generate a portion of a physical design layout corresponding to the recognized topology in the circuit design. The tools also can compare results from a simulation of the circuit design that correspond to the transistors in the recognized circuit topology to the simulation criteria to determine whether the transistors in the recognized circuit topology meet design specifications.

20 Claims, 7 Drawing Sheets

(56) References Cited

U.S. PATENT DOCUMENTS

| | | | | |
|---|---|---|---|---|
| 8,726,218 B2* | 5/2014 | Maziasz | ............... | G06F 17/505 |
| | | | | 716/127 |
| 8,788,990 B2* | 7/2014 | Meserve | ............... | G06F 17/505 |
| | | | | 716/100 |
| 8,893,069 B2* | 11/2014 | Su | ............... | G06F 17/5063 |
| | | | | 716/102 |
| 9,256,706 B2* | 2/2016 | Chen | ............... | G06F 17/5077 |

* cited by examiner

RECOGNIZING AND UTILIZING CIRCUIT TOPOLOGY IN AN ELECTRONIC CIRCUIT DESIGN

RELATED APPLICATION

This patent application claims priority to U.S. Provisional Patent Application No. 62/262,800, filed Dec. 3, 2015, which is incorporated by reference herein.

TECHNICAL FIELD

This application is generally related to electronic design automation and, more specifically, to recognizing and utilizing circuit topology in a development of an analog and mixed signal electronic circuit design.

BACKGROUND

Designing and fabricating an analog and mixed signal electronic circuit typically involves many steps, known as a "design flow," which are often divided into two phases, a front-end phase and a back-end phase. In the front-end phase, a designer can utilize one or more design tools to generate a schematic representation for the electronic circuit. Then, software tools can covert the schematic representation into a Simulation Program with Integrated Circuit Emphasis (SPICE) netlist or the like, and verify the electronic design conforms to certain design specifications, for example, by running software simulators or hardware emulators. Depending on the results of the verification, the designers can modify the schematic representation for the electronic circuit, and verify the modified electronic design conforms to certain design specifications. This verification and modification process is often iteratively performed until the designer has created a schematic representation for the electronic circuit that conforms to the design specifications.

In the back-end phase, the schematic representation for the electronic circuit created in the front-end phase can be utilized to generate a physical layout design representation of the electronic circuit. The designer can generate the physical layout design by utilizing at least one layout tool to place devices in a layout and connect them together based on the schematic representation for the electronic circuit or a corresponding SPICE netlist.

Once generated, the physical layout design can undergo multiple different tests. For example, the designer can perform a design rule check to determine whether the layout dimensions in the physical layout design violate design rules. The designer also can perform a Layout Versus Schematic (LVS) test to determine whether the physical layout design corresponds to the schematic representation for the electronic circuit. The designer also can extract a parasitic electrical model and layout dependent parameters of the physical layout design and compare them against the design specifications, for example, to determine whether electrical parasitics in the routing or layout dependent effects (LDE), such as well proximity effects (WPE) or the like, deviate from the design specifications.

When the physical layout design fails any of these tests, the designer can re-preform the back-end process, for example, re-placing and re-routing the schematic representation to generate a new physical layout design and then re-test the new physical layout design. As new technology nodes get smaller, however, layout dependent effects become more pervasive and designers typically either have to perform more back-end iterations to meet design specifications or have to re-perform the front-end phase and generate a new schematic representation. Since the layout dependent effects are introduced during the place and route process, they are often difficult to account for in the front-end phase of the design flow. Thus, with the utilization of new process nodes, many designers iterate both in the front-end phase of the design flow and the back-end phase of the design flow—extending design time—in order to find a physical layout design that can meet design specifications.

SUMMARY

This application discloses tools and mechanisms capable of building a topology library including one or more topologies, each of which includes a description of multiple transistors, their parameters, and associated connectivity, and also includes rules or criteria to be utilized in downstream design flow processes. The tools can utilize the topology library to analyze a circuit design describing an electronic device to recognize a subset of transistors in the electronic device has a pre-defined circuit topology, and identify layout rules or simulation criteria for the transistors in the recognized circuit topology. The tools can utilize the layout rules to automatically generate a portion of a physical design layout corresponding to the recognized topology in the circuit design. The tools also can compare results from a simulation of the circuit design that correspond to the transistors in the recognized circuit topology to the simulation criteria to determine whether the transistors in the recognized circuit topology meet design specifications. Embodiments will be described below in greater detail.

DETAILED DESCRIPTION

Illustrative Operating Environment

The execution of various electronic design automation processes and supply chain security protocols according to embodiments of the invention may be implemented using computer-executable software instructions executed by one or more programmable computing devices. Because these embodiments of the invention may be implemented using software instructions, the components and operation of a programmable computer system on which various embodiments of the invention may be employed will first be described. Further, because of the complexity of some electronic design automation processes, the large size of many circuit designs, and supply chain security protocols, various electronic design automation tools, security servers, or the like, can be configured to operate on a computing system capable of simultaneously running multiple processing threads.

Figure 1:
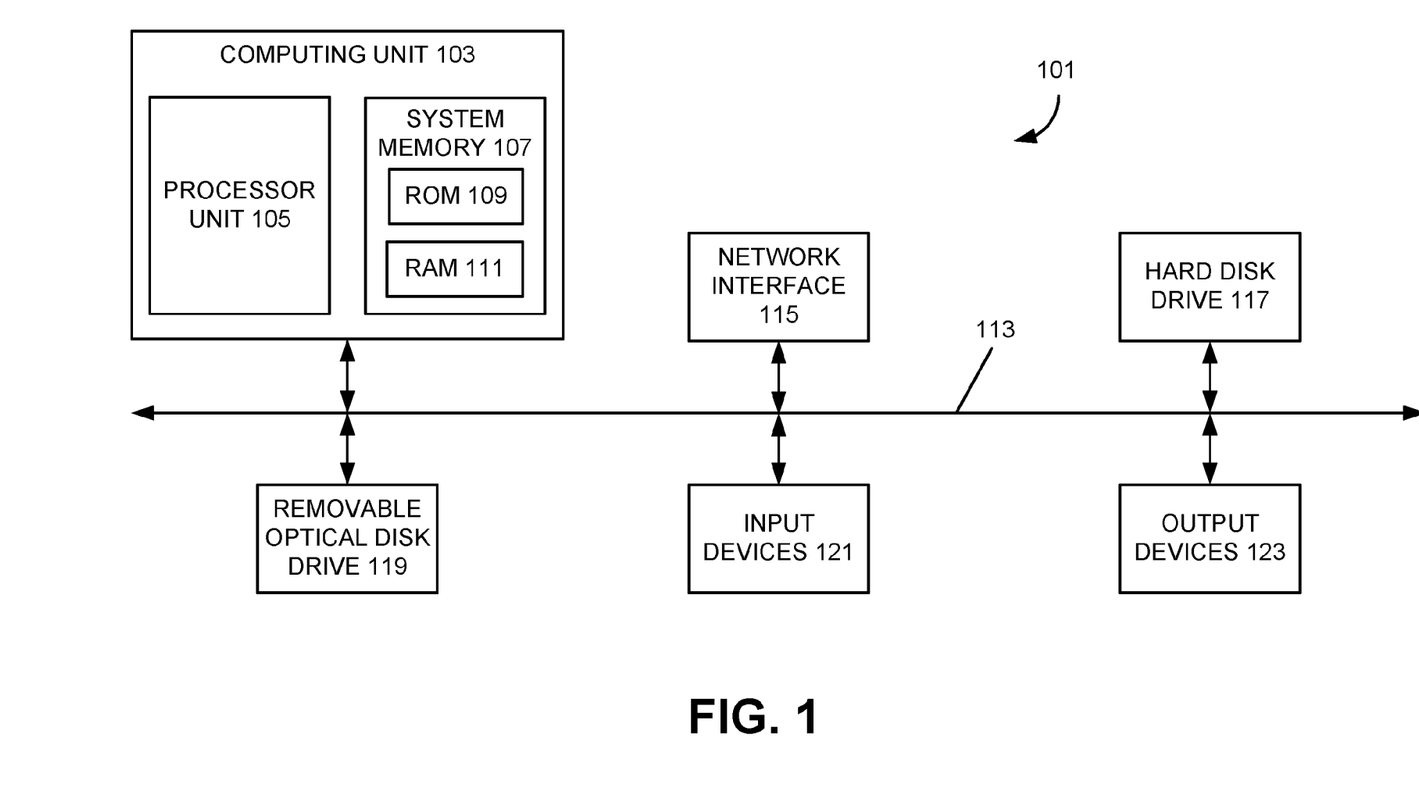
FIGS. 1 and 2 illustrate an example of a computer system of the type that may be used to implement various embodiments of the invention.

Various examples of the invention may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
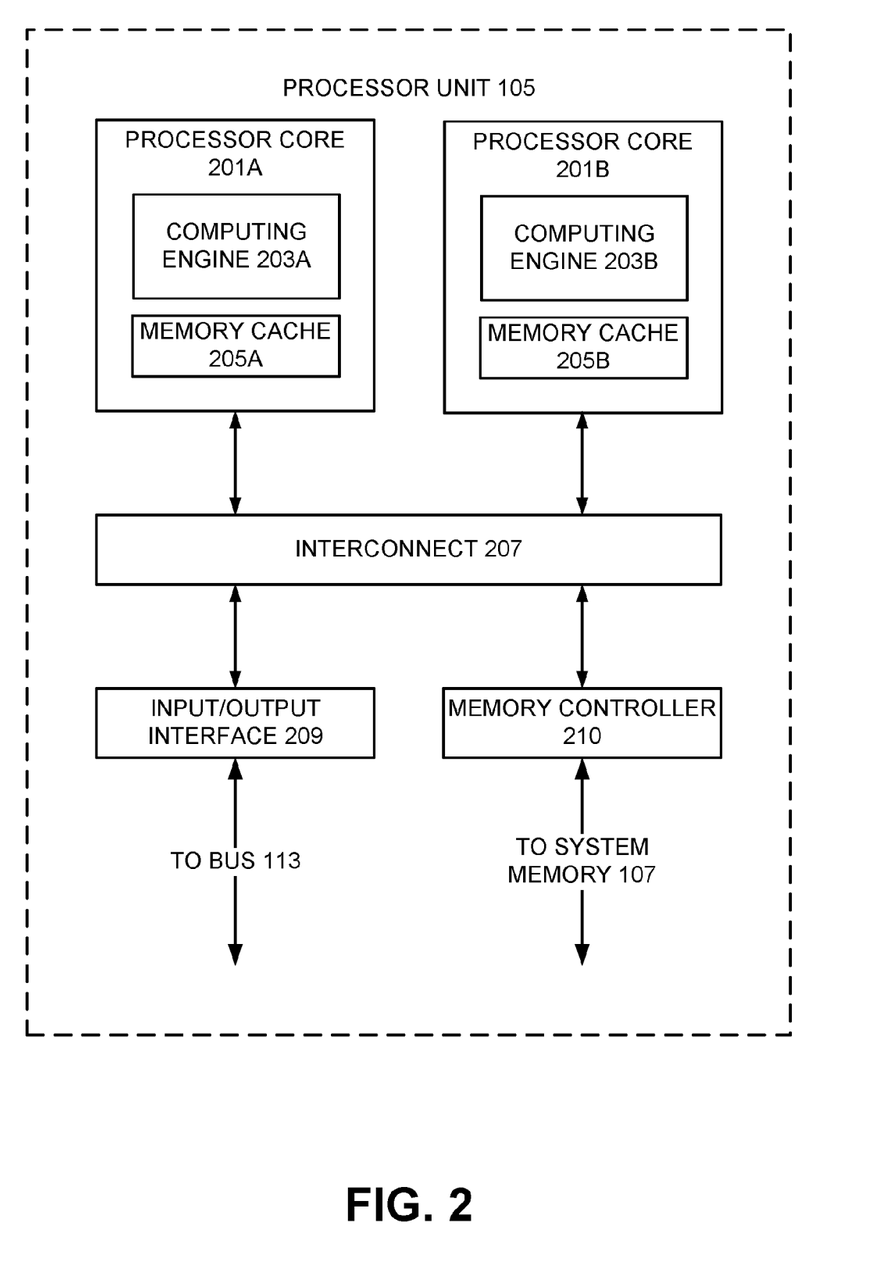

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface between the processor unit 105 and the bus 113. Similarly, the memory controller 210 controls the exchange of information between the processor unit 105 and the system memory 107. With some implementations of the invention, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments of the invention.

Electronic Device Design Flow with Example Topology Recognition

Figure 3:
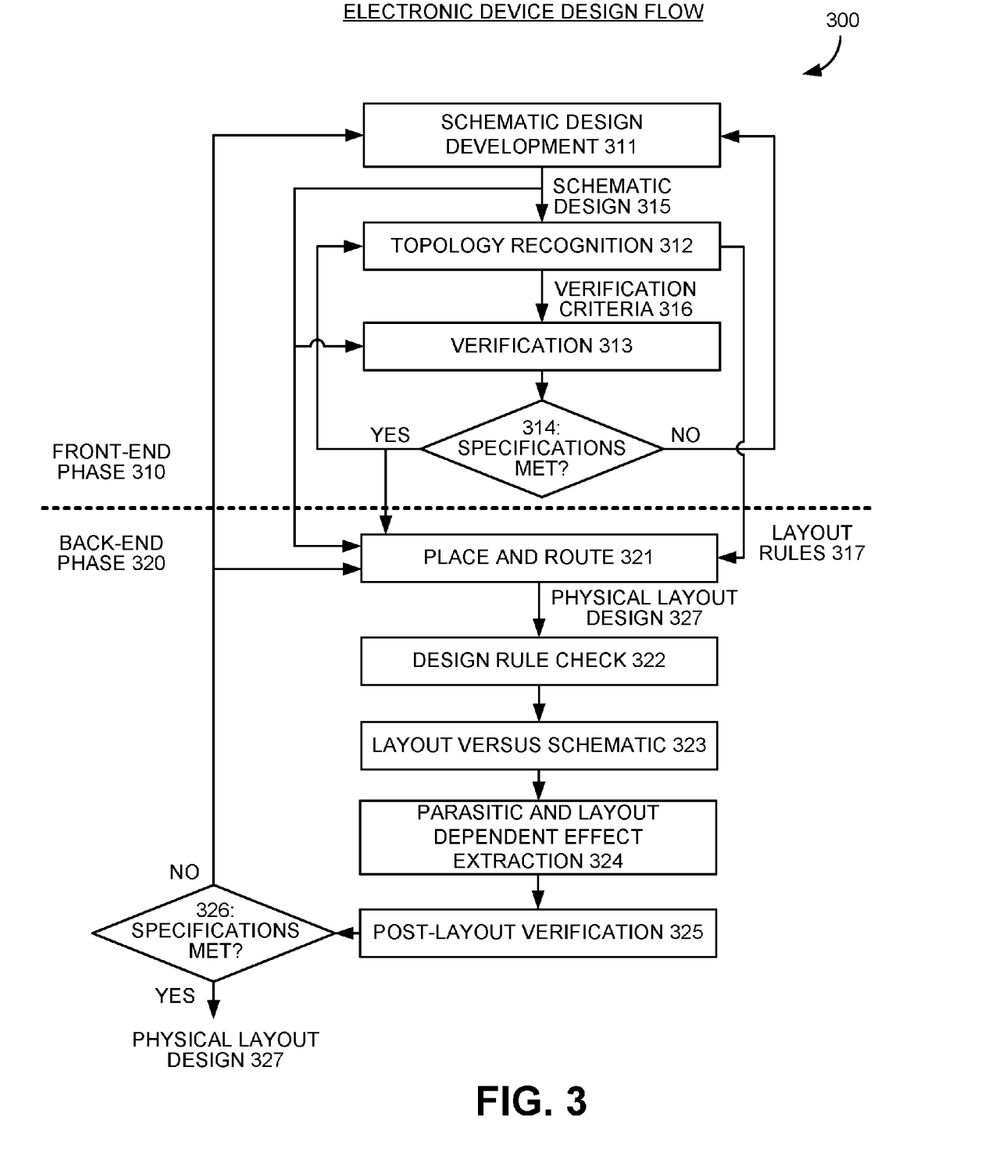
FIG. 3 illustrates an electronic device design flow including an example topology recognition that may be implemented according to various embodiments of the invention.

FIG. 3 illustrates an electronic device design flow 300 including example topology recognition 312 that may be implemented according to various embodiments of the invention. Referring to FIG. 3, the electronic device design flow 300 can develop a circuit design for an electronic device, which, in some embodiments, can be an analog or mixed signal electronic circuit. The electronic device design flow 300 can include a front-end phase 310 to generate a schematic design 315 for an electronic device and a back-end phase 320 to generate a physical layout design 327 for the electronic device from the schematic design 315.

The front-end phase 310 can include one or more design tools implemented by at least one computing system that can include different stages, such as schematic design development 311, topology recognition 312, and verification 313. A schematic design 315, which can represent the electronic device at a transistor-level of abstraction, can be generated in the schematic design development 311 stage. In some examples, the schematic design 315 can describe the electronic device as a system of transistors and their associated connectivity to each other, themselves, power net(s), and/or ground net(s).

The schematic design 315 can be analysed in the topology recognition 312 stage to identify groups of transistors in the schematic design 315 that correspond to particular device topologies, which, for example, could be stored in a topology library. The device topologies can correspond to any number of different circuit devices, such as current mirrors, operation amplifiers, differential pairs, or the like. In response to identifying a device topology in the schematic design 315, the topology recognition 312 stage can output verification criteria 316 or layout rules 317, which can be utilized in the front-end phase 310 and back-end phase 320, respectively. Embodiments of topology recognition will be described below in greater detail.

In the verification 313 stage, a representation of the schematic design 315 along with a test bench can be simulated or emulated, which can generate an output, such as waveform data or the like, based on a functionality of the electronic device described in the schematic design 315. In some embodiments, the schematic design 315 can be converted into a Simulation Program with Integrated Circuit Emphasis (SPICE) netlist or the like, for example, in at least one of the schematic design development 311, topology recognition 312, or verification 313 stages, and the SPICE netlist can be simulated or emulated in the verification 313 stage.

The output of the verification 313 stage can be compared to design specifications for the electronic device, for example, shown in decision block 314. The verification criteria 316 for any device topologies identified in the schematic design 315 can be utilized during the comparison to verify that the device topology functions in accordance with the verification criteria 316. In some embodiments, the verification criteria 316 can include electrical constraints for the corresponding device topologies, which can be specified as simulation commands, design specifications, or the like. Although FIG. 3 shows the comparison of the output from the verification stage 313 to design specifications being performed outside of the various stages in the front-end phase 310, in some embodiments, the comparison can be performed in any of the stages of the front-end phase 310.

When the comparison indicates that the functionality described in the schematic design 315 does not meet the design specifications, the front-end phase 310 iterates, for example, back to the schematic design development 311 stage for the existing schematic design 315 to be modified or for a new schematic design to be generated. When the comparison indicates that the functionality described in the schematic design 315 does meet the design specifications, the front-end phase 310 can be completed and the schematic design 315 having met the specifications along with any layout rules 317 identified by the topology recognition 312 stage can be passed to the back-end phase 320.

The back-end phase 320 can include one or more design tools implemented by at least one computing system that can include different stages, such as a place and route 321 stage, a design rule check 322 stage, a layout versus schematic (LVS) 323 stage, a parasitic and layout dependent effect (LDE) extraction 324, and a post-layout verification 325 stage.

In the back-end phase 320, the schematic design 315 for the electronic device created in the front-end phase 310 can be utilized by the place and route 321 stage to generate a physical layout design 327 representation of the electronic device. The place and route 321 stage can place structures in the physical layout design 327 corresponding to the transistors in the schematic design 315, and then connect the placed structured to each other, themselves, to power sources and/or ground, or the like based on the connectivity described in the schematic design 315. In some embodiments, a tool can generate at least a portion of the physical layout design 327 automatically based on layout rules, such as layout rules 317. For example, when the topology recognition 312 stage in the front-end phase 310 identifies a device topology and corresponding layout rules 317, the tool implementing the place and route 321 stage can automatically generate a physical representation for that device topology in the physical design layout 327 with the layout rules 317.

The physical layout design 327 can undergo multiple different tests in the back-end phase 320. The physical layout design 327 can be analysed to determine whether the physical layout of the electronic device satisfies a series of parameters called Design Rules. The physical layout design 327 also can be compared against the schematic design 315 in the layout versus schematic (LVS) 323 stage, which can determine whether the physical layout design 327 corresponds to the schematic design 315 for the electronic device. Parasitic electrical characteristics, for example, in a parasitic electrical model, and layout dependent parameters of the physical layout design 327 can be extracted and compared against the design specifications in the parasitic and layout dependent effect extraction 324 stage, for example, to determine whether electrical parasitics in the routing or layout dependent effects (LDE), such as well proximity effects (WPE) or the like, deviate from the design specifications. The physical layout design 327 also can undergo a post-layout verification 325 stage, where a representation of the physical layout design 327 along with a test bench can be simulated or emulated to generate an output, such as waveform data or the like, based on a functionality of the electronic device described in the s physical layout design 327. In some embodiments, the physical layout design 327 can be converted into a SPICE netlist or the like, and the SPICE netlist can be simulated or emulated in the post-layout verification 325 stage.

The output of the post-layout verification 325 stage can be compared to design specifications for the electronic device, for example, shown in decision block 326. Although FIG. 3 shows the comparison of the output from the post-layout verification 325 stage to design specifications being performed outside of the various stages in the back-end phase 320, in some embodiments, the comparison can be performed in any of the stages of the back-end phase 320.

When the comparison indicates that the functionality described in the physical layout design 327 does not meet the design specifications, the back-end phase 320 iterates, for example, back to the place and route 321 stage for the existing physical layout design 327 to be modified or for a new physical layout design to be generated. In some embodiments, failure to meet the design specifications via the post-layout verification 325 stage, can cause the design flow to iterate back to the front-end phase 310, for a new schematic design 315 to be generated. When the comparison indicates that the functionality described in the physical layout design 327 does meet the design specifications, the design flow 300 can be completed and the physical layout design 327 can be utilized to fabricate the electronic device.

Example Topology Recognition Tool

Figure 4:
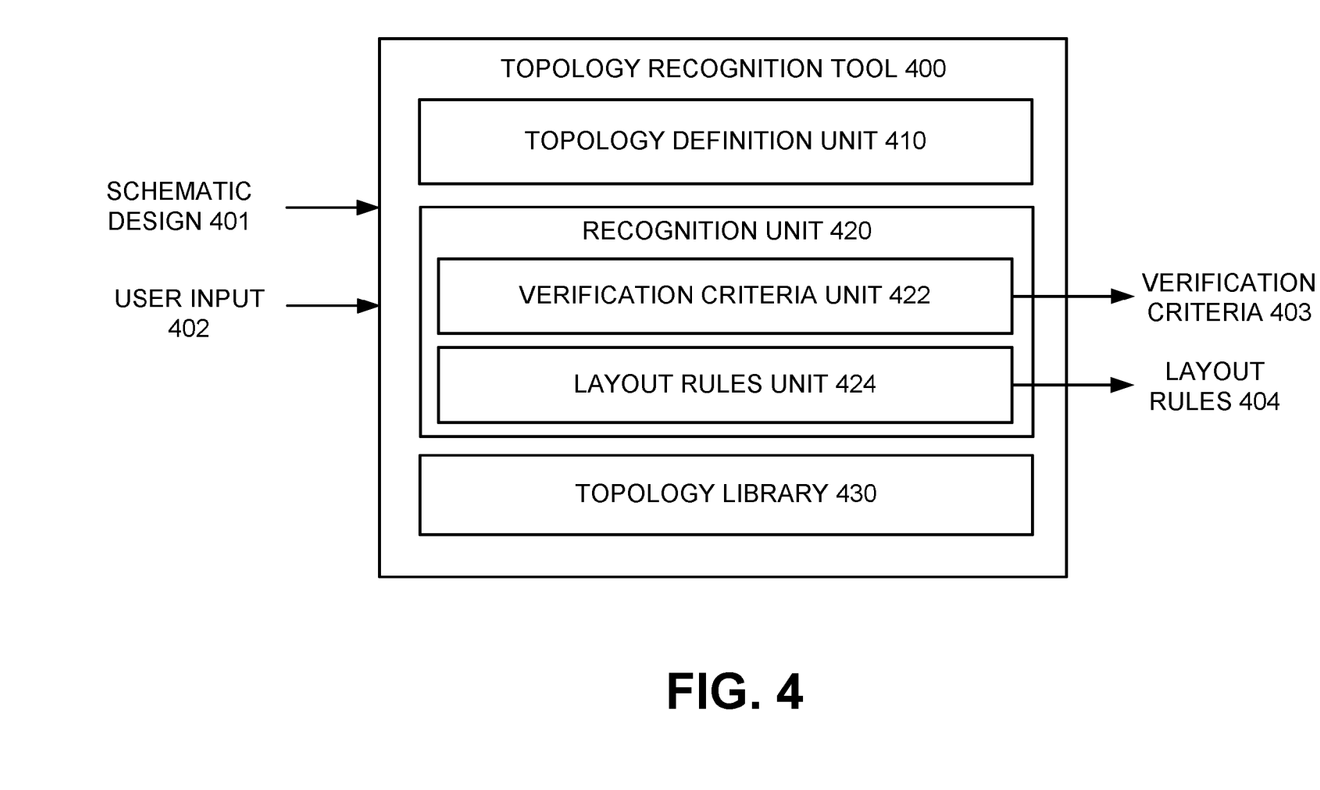
FIG. 4 illustrates an example of a topology tool that may be implemented according to various embodiments of the invention.

FIG. 4 illustrates an example of a topology recognition tool 400 that may be implemented according to various embodiments of the invention. Referring to FIG. 4, the topology recognition tool 400 can receive a schematic design 401, which can describe an electronic device at a transistor-level of abstract. In some examples, the schematic design 401 can describe the electronic device as a system of transistors and their associated connectivity to each other, themselves, power net(s), and/or ground net(s).

The topology recognition tool 400 can identify one or more topologies in the schematic design 401 automatically or based on user input 402. A topology can describe multiple transistors and their associated connectivity to each other, themselves, power net(s), and/or ground net(s). The topology recognition tool 400 can output constraint parameters, such as verification criteria 403 and/or layout rules 404 corresponding to the identified topologies, which can be utilized by downstream tools, such as a design verification tool or a place and route tool, respectively.

The topology recognition tool 400 can include a topology definition unit 410 to generate one or more topologies for utilization in subsequent recognition operations. The topology definition unit 410 can store the generated topologies in a topology library 430 included in the topology recognition tool 400. Examples of topology generation by the topology definition unit 410 will be described below in FIG. 5.

Figure 5:
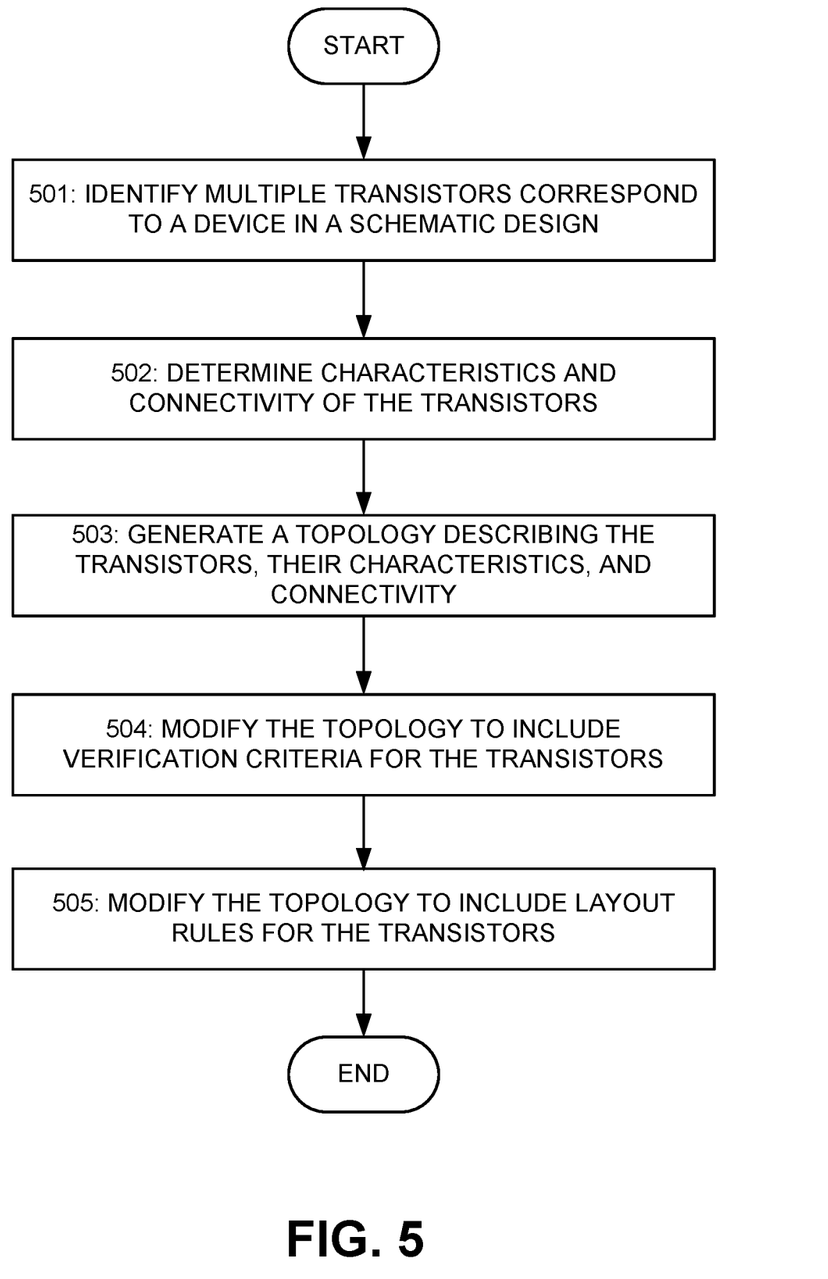
FIG. 5 illustrates a flowchart showing an example topology generation according to various examples of the invention.

FIG. 5 illustrates a flowchart showing an example topology generation according to various examples of the invention. Referring to FIG. 5, in a block 501, a computing system, for example, implementing the topology recognition tool 400 described in FIG. 4, can identify multiple transistors that correspond to a device in a schematic design. In some embodiments, the topology definition unit 410 in the topology recognition tool 400 can identify a group or set of multiple transistors in the schematic design that corresponds to specific electric device, such as a current mirror, operational amplifier, differential pair, or the like, based on user input.

In a block 502, the computing system can determine characteristics and connectivity of the transistors. In some embodiments, the topology definition unit 410 can analyze the identified transistors in the schematic design to determine their characteristics, such as transistor type, transistor width, transistor length, transistor finger, and connectivity. The connectivity of the identified transistors can correspond to connections between the transistors, any self-connections, connection(s) to power net(s), and/or connection(s) to ground net(s). The topology definition unit 410 also can analyze the schematic design 401 to determine relationships between the identified transistors, such as ratio of transconductance (gm) to current (Id) for each transistor, ratios of total transistor width across each transistor type, or the like. In some embodiments, one or more of the characteristics can be determined by the computing system in response to user input defining the characteristics for identified transistors.

In a block 503, the computing system can generate a topology describing the transistors, their characteristics and/or relationships, and connectivity. In some embodiments, the computing system can receive user input defining a name of the topology, which the computing system can add to the generated topology. The computing system also can store the generated topology in the topology library 430 included in the topology recognition tool 400.

In a block 504, the computing system can modify the topology to include verification criteria for the transistors. The computing system can receive the verification criteria, for example, as user input, which can be added to the generated topology. In some embodiments, the verification criteria can include electrical constraints for the corresponding topology, such as output voltages, output currents, or the like, from the topology, which can be specified as simulation commands, design specifications, or the like.

In a block 505, the computing system can modify the topology to include layout rules for the transistors. The computing system can receive the layout rules, for example, as user input, which can be added to the generated topology. In some embodiments, the layout rules can be commands that, when implemented in a place and route tool, can automatically drive a physical layout of the transistors in the topology. By utilizing the same layout rules for each instance of a topology, the place and route tool can automatically replicate the same physical layout for each instance of the topology.

Referring back to FIG. 4, the topology recognition tool 400 can include a recognition unit 420 to analyze the schematic design 401 to identify whether the schematic design 401 includes one or more topologies in stored in the topology library 430. In some embodiments, the recognition unit 420 can search the schematic design 401 on a topology-by-topology basis, for example, by selecting a topology and then identifying if the schematic design 401 includes the selected topology. In some examples, the recognition unit 420 can search the schematic design 401 for the selected topology by filtering or sorting the transistors in the schematic design 401 by the transistor type, such as p-channel metal-oxide-semiconductor (PMOS) or n-channel metal-oxide-semiconductor (NMOS) transistor, and then additionally filter or sort the list of remaining transistors by other transistor parameters, relationships between transistors, and/or connectivity until a group of transistors that matches the topology has been found, or not. The recognition unit 420 can, of course, search the schematic design 401 for multiple topologies in parallel, and/or search multiple characteristics of the topology in parallel as well.

The recognition unit 420 can include a verification criteria unit 422 to output verification criteria 403 corresponding to a topology found in the schematic design 401. Embodiments of the topology recognition and associated verification criteria utilization will be described below in FIG. 6.

Figure 6:
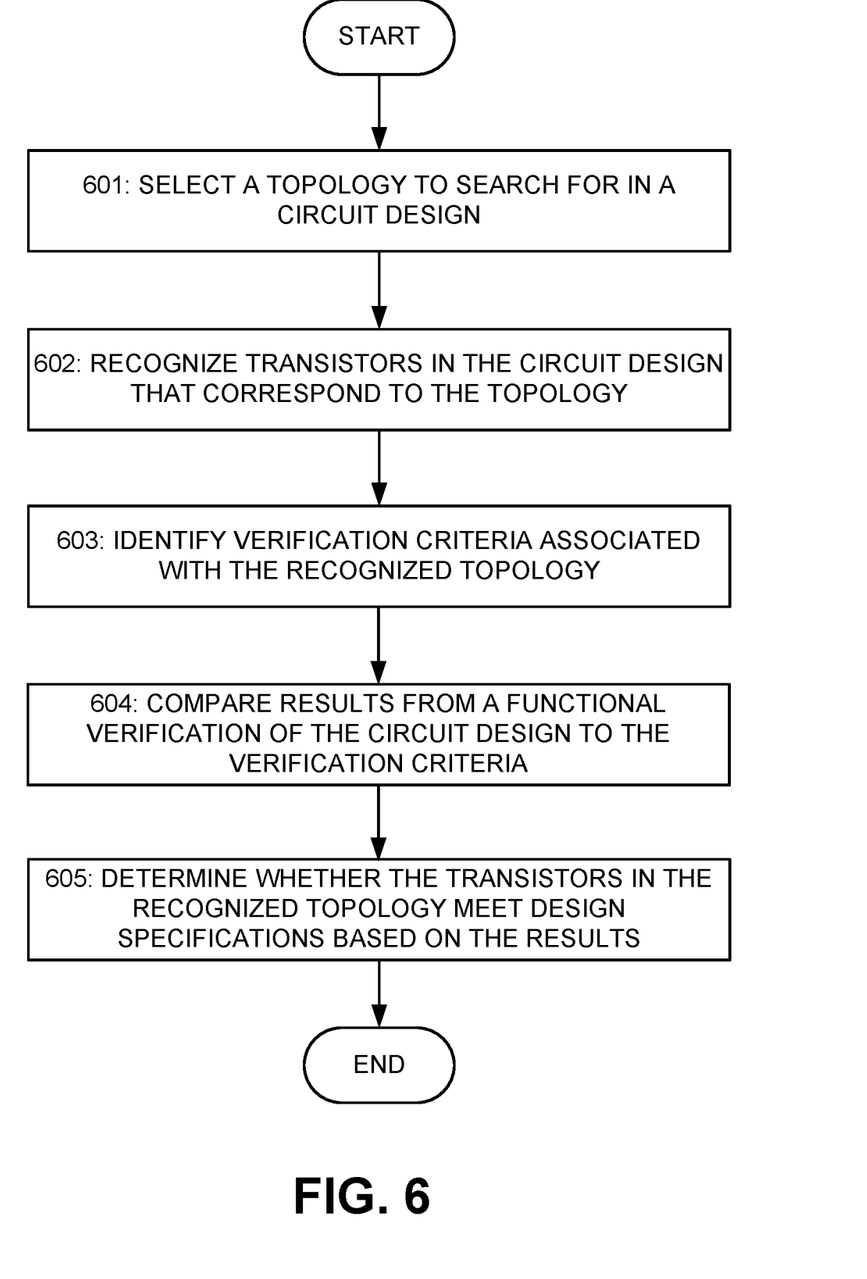
FIG. 6 illustrates a flowchart showing an example topology recognition and associated verification criteria utilization according to various examples of the invention.

FIG. 6 illustrates a flowchart showing an example topology recognition and associated verification criteria utilization according to various examples of the invention. Referring to FIG. 6, in a block 601, a computing system, for example, implementing the topology recognition tool 400 described in FIG. 4, can select a topology to search for in a circuit design, and in a block 602, the computing system can recognize transistors in the circuit design that correspond to the selected topology. In some embodiments, the computing system can identify transistors in the circuit design that have a type capable of being included in the selected topology, and then iteratively comparing the identified transistors against other topology characteristics, such as transistor parameters, relationships between transistors, and/or connectivity, to determine whether the circuit design includes the selected topology.

In a block 603, the computing system can identify verification criteria associated with the recognized topology. The computing system, in some embodiments, can extract the verification criteria from the topology, for example, stored in a topology library, or the computing system can extract the verification criteria from another storage location based on a reference or pointer associated with the topology.

In a block 604, the computing system can compare results from a functional verification of the circuit design to the verification criteria, and in a block 605, the computing system can determine whether the transistors in the recognized topology meet design specifications based on the results. A verification tool, such as a simulator or emulator, can perform functional verification on the circuit design, and output waveform data corresponding to the functional operation of the circuit design. The computing system can compare the waveform data to the verification criteria to determine whether the circuit design, as simulated or emulated, electrically functions according to the verification criteria corresponding to the topology.

Referring back to FIG. 4, the recognition unit 420 can include a layout rules unit 434 to output layout rules 404 corresponding to a topology found in the schematic design 401. Embodiments of the topology recognition and associated verification criteria utilization will be described below in FIG. 7.

Figure 7:
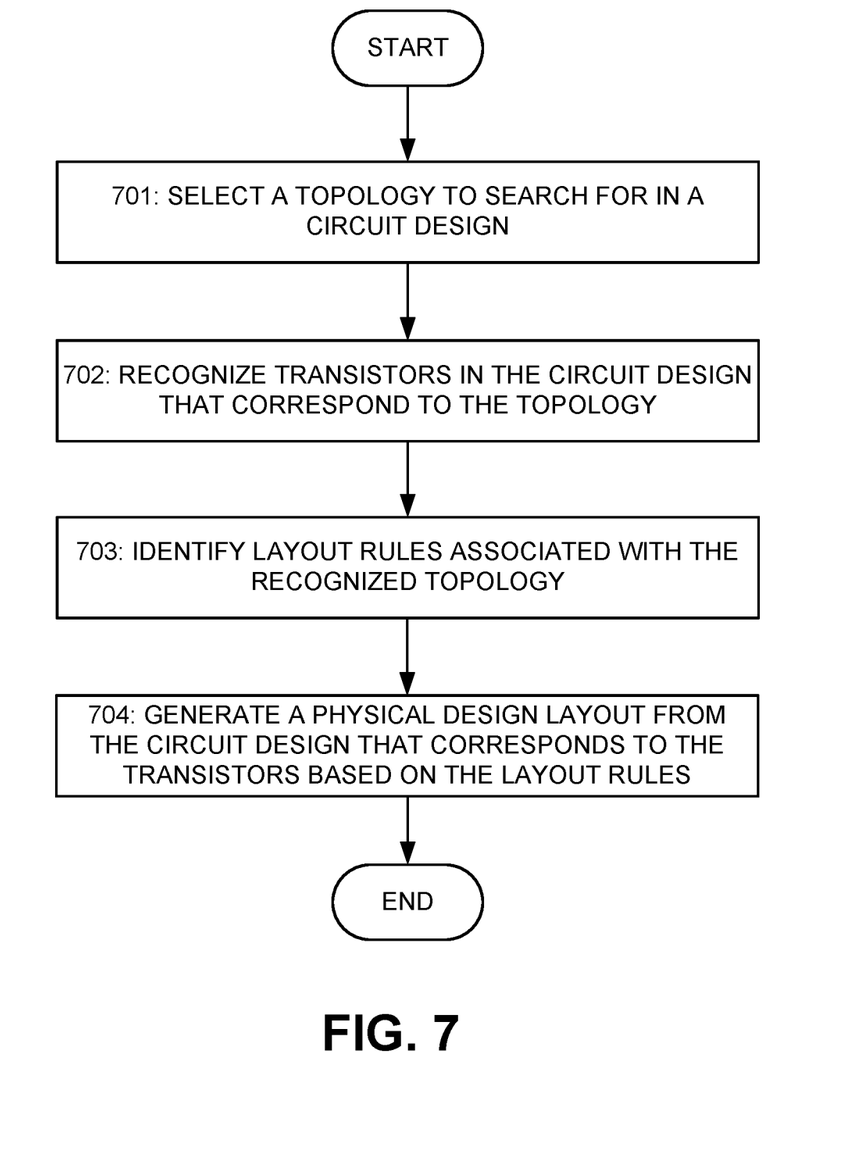
FIG. 7 illustrates a flowchart showing an example topology recognition and associated layout rules utilization according to various examples of the invention.

FIG. 7 illustrates a flowchart showing an example topology recognition and associated layout rules utilization according to various examples of the invention. Referring to FIG. 7, in a block 701, a computing system, for example, implementing the topology recognition tool 400 described in FIG. 4, can select a topology to search for in a circuit design, and in a block 702, the computing system can recognize transistors in the circuit design that correspond to the selected topology. In some embodiments, the computing system can identify transistors in the circuit design that have a type capable of being included in the selected topology, and then iteratively comparing the identified transistors against other topology characteristics, such as transistor parameters, relationships between transistors, and/or connectivity, to determine whether the circuit design includes the selected topology.

In a block 703, the computing system can identify layout rules associated with the recognized topology. The computing system, in some embodiments, can extract the layout rules from the topology, for example, stored in a topology library, or the computing system can extract the layout rules from another storage location based on a reference or pointer associated with the topology.

In a block 704, the computing system can generate a physical design layout from the circuit design that corresponds to the transistors based on the layout rules. The computing system can implement a place and route tool, which can utilize the layout rules to automatically generate portions of the physical design layout corresponding to the recognized topology in the circuit design.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
analyzing, by a computing system, a schematic circuit design describing an electronic device to recognize that a subset of transistors of the electronic device has a pre-defined circuit topology;
identifying, by the computing system, development information for the transistors in the recognized circuit topology;
comparing, by the computing system, verification criteria in the development information to results of functional verification of the electronic device described by the schematic circuit design to determine whether the transistors in the recognized circuit topology meet design specifications; and
generating a physical design layout from a netlist converted from the schematic circuit design after the design specifications are met for the transistors in the recognized circuit topology.

2. The method of claim 1, wherein analyzing the schematic circuit design to recognize the subset of transistors further comprises:
accessing the pre-defined circuit topology from a topology library; and
performing a recursive comparison of transistors described in the schematic circuit design to recognize the subset of the transistors in the electronic device has the pre-defined circuit topology.

3. The method of claim 2, wherein identifying the development information further comprises ascribing layout rules to the transistors in the schematic circuit design recognized as corresponding to the pre-defined circuit topology.

4. The method of claim 2, wherein the pre-defined circuit topology in the topology library includes a listing of transistors, their associated parameters, and at least one of connectivity to each other, connectivity to power and ground nets, or connectivity to themselves.

5. The method of claim 4, wherein the parameters of at least one of the transistors include at least one of a multiplication factor (M-factor), transistor dimensions, or transistor type.

6. The method of claim 1, simulation criteria wherein the development information includes layout rules for the transistors in the recognized circuit topology, and wherein generating the physical design layout further comprises incorporating structures corresponding the transistors identified from the recognized circuit topology into the physical design layout based, at least in part, on the layout rules for the transistors in the recognized circuit topology.

7. The method of claim 1, wherein the schematic circuit design describes an analog or mixed-signal electronic device at a transistor level of abstraction.

8. A device comprising:
a memory device configured to store machine-readable instructions; and
a computing system including one or more processing devices, in response to executing the machine-readable instructions, configured to:
analyze a schematic circuit design describing an electronic device to recognize that a subset of transistors of the electronic device has a pre-defined circuit topology;
identify development information for the transistors in the recognized circuit topology; and
compare verification criteria in the development information to results of functional verification of the electronic device described by the schematic circuit design to determine whether the transistors in the recognized circuit topology meet design specifications, wherein a physical design layout is generated from a netlist converted from the schematic circuit design after the design specifications are met for the transistors in the recognized circuit topology.

9. The device of claim 8, wherein the one or more processing devices, in response to executing the machine-readable instructions, are configured to analyze the schematic circuit design to recognize the subset of transistors by accessing the pre-defined circuit topology from a topology library, and performing a recursive comparison of transistors described in the schematic circuit design to recognize the subset of the transistors in the electronic device has the pre-defined circuit topology.

10. The system of claim 9, wherein the one or more processing devices, in response to executing the machine-readable instructions, are configured to identify the development information by ascribing layout rules to the transistors in the schematic circuit design recognized as corresponding to the pre-defined circuit topology.

11. The system of claim 9, wherein the pre-defined circuit topology in the topology library includes a listing of transistors, their associated parameters, and at least one of connectivity to each other, connectivity to power and ground nets, or connectivity to themselves.

12. The system of claim 11, wherein the parameters of at least one of the transistors include at least one of a multiplication factor (M-factor), transistor dimensions, or transistor type.

13. The system of claim 8, wherein the development information includes layout rules for the transistors in the recognized circuit topology, and wherein generating the physical design layout further comprises incorporating structures corresponding the transistors identified from the recognized circuit topology into the physical design layout based, at least in part, on the layout rules for the transistors in the recognized circuit topology.

14. An apparatus comprising at least one computer-readable memory device storing instructions configured to cause one or more processing devices to perform operations comprising:
analyzing a schematic circuit design describing an electronic device to recognize that a subset of transistors of the electronic device has a pre-defined circuit topology;
identifying development information for the transistors in the recognized circuit topology; and
comparing verification criteria in the development information to results of functional verification of the electronic device described by the schematic circuit design to determine whether the transistors in the recognized circuit topology meet design specifications, wherein a physical design layout is generated from a netlist converted from the schematic circuit design after the design specifications are met for the transistors in the recognized circuit topology.

15. The apparatus of claim 14, wherein analyzing the schematic circuit design to recognize the subset of transistors further comprises:
   accessing the pre-defined circuit topology from a topology library; and
   performing a recursive comparison of transistors described in the schematic circuit design to recognize the subset of the transistors in the electronic device has the pre-defined circuit topology.

16. The apparatus of claim 15, wherein identifying the development information further comprises ascribing layout rules or simulation criteria to the transistors in the schematic circuit design recognized as corresponding to the pre-defined circuit topology.

17. The apparatus of claim 15, wherein the pre-defined circuit topology in the topology library includes a listing of transistors, their associated parameters, and at least one of connectivity to each other, connectivity to power and ground nets, or connectivity to themselves.

18. The apparatus of claim 17, wherein the parameters of at least one of the transistors include at least one of a multiplication factor (M-factor), transistor dimensions, or transistor type.

19. The apparatus of claim 14, wherein the development information includes layout rules for the transistors in the recognized circuit topology, and wherein generating the physical design layout further comprises incorporating structures corresponding the transistors identified from the recognized circuit topology into the physical design layout based, at least in part, on the layout rules for the transistors in the recognized circuit topology.

20. The apparatus of claim 14, wherein the schematic circuit design describes an analog or mixed-signal electronic device at a transistor level of abstraction.

\* \* \* \* \*